(12) United States Patent
Lee

(10) Patent No.: US 9,852,779 B2
(45) Date of Patent: Dec. 26, 2017

(54) DUAL-PORT DDR4-DIMMS OF SDRAM AND NVRAM FOR SSD-BLADES AND MULTI-CPU SERVERS

(71) Applicant: Futurewei Technologies, Inc., Plano, TX (US)

(72) Inventor: Xiaobing Lee, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 355 days.

(21) Appl. No.: 14/656,488

(22) Filed: Mar. 12, 2015

(65) Prior Publication Data

US 2015/0262633 A1 Sep. 17, 2015

Related U.S. Application Data

(60) Provisional application No. 61/951,991, filed on Mar. 12, 2014.

(51) Int. Cl.
*G06F 13/36* (2006.01)
*G11C 7/10* (2006.01)
*G11C 5/04* (2006.01)
*G11C 11/00* (2006.01)

(52) U.S. Cl.
CPC ............. *G11C 7/1075* (2013.01); *G11C 5/04* (2013.01); *G11C 11/005* (2013.01)

(58) Field of Classification Search
None
See application file for complete search history.

(56) References Cited

U.S. PATENT DOCUMENTS

| 9,052,840 B2* | 6/2015 | Cordero | G06F 3/067 |
| 2013/0086311 A1* | 4/2013 | Huang | G06F 13/1689 |
| | | | 711/103 |

* cited by examiner

*Primary Examiner* — Idriss N Alrobaye
*Assistant Examiner* — Richard B Franklin
(74) *Attorney, Agent, or Firm* — Schwegman Lundberg & Woessner, P.A.

(57) ABSTRACT

A memory system is disclosed that includes a first FPGA controller coupled to a first SSD cluster, a first DDR4 DIMM and a second DDR4 DIMM. A second FPGA controller is coupled to a second SSD cluster, the first DDR4 DIMM and the second DDR4 DIMM, where the first and second FPGAs are operable to share access to the first and second DDR4 DIMMs and provide connectivity to a plurality of network resources. The dual-port design enables the use of existing SDRAM, MRAM and RRAM chips at low speed rates to reach DDR4 2.0 speed DIMM devices. The dual-port DDR4 DIMM comprises 1-to-2 data buffer splitters and a DDR3 or DDR2 to DDR4 bus adaptation/termination/relaying circuits to increase (e.g., double or quadruple) the chip speed of SDRAM, MRAM, and RRAM chips.

19 Claims, 9 Drawing Sheets

DUAL-PORT DDR4-DIMMS OF SDRAM AND NVRAM FOR SSD-BLADES AND MULTI-CPU SERVERS

CROSS-REFERENCE TO RELATED APPLICATIONS

The present application claims priority to provisional application Ser. No. 61/951,991, filed on Mar. 12, 2014, entitled "DUAL-PORT DDR4-DIMMS OF SDRAM AND NVRAM FOR SSD-BLADES AND MULTI-CPU SERVERS" naming the same inventors as in the present application. The contents of the above referenced provisional application are incorporated by reference, the same as if fully set forth herein.

FIELD

The present invention generally relates to the field of random access memory (RAM). More specifically, the present invention is related to dual-port dual in-line memory modules (DIMMs) using fourth generation synchronous dynamic random-access memory technology.

BACKGROUND

Random Access Memory is a common form of computer data storage where data items are read and written in roughly the same amount of time regardless of the order in which data items are accessed. Integrated-circuit RAM chips have been available for several decades. Two main forms of RAM today are static RAM (SRAM) and dynamic RAM (DRAM). DRAM is less expensive and more common than SRAM. DRAM stores a bit of data using a memory cell comprising a transistor and capacitor pair. The cell holds a high charge (1) or a low charge (0). The transistor acts as a switch to change from a high charge to a low charge. Traditional storage systems and servers utilize CPUs with dedicated single-port DDR4, DDR3, or DDR2 DIMMs of DRAM. Additionally, many current storage systems and servers utilize dual-port serial attached SCSI (SAS) SSD devices or dual-port Non-Volatile Memory Express (NVME) SSD devices.

Double data rate fourth generation synchronous dynamic random-access memory (DDR4 DRAM) and non-volatile memory (NVM) technologies have been developed as single-port modules directly attached to a CPU. DDR4 provides a multi-channel architecture of point-to-point connections for CPUs hosting multiple high-speed DDR4-DIMMs rather than multi-drop DDR2/3 bus technologies. However, this technology has not been adopted yet, and the vast majority of DDR4 motherboards are still based on multi-drop bus topology. High density SSD storage systems and large-scale NVM systems need to use dual-port primary storage modules that are similar to higher reliability SAS-HDD devices for avoiding single-point failures along a data path. The greater the SSD/NVM density, the more critical the primary SSD/NVM device will be.

While high-end storage systems require dual-port DDR4-DIMM to improve system reliability and availability, current low-cost SDRAM, MRAM and ReRAM chips do not support DDR4 speed. What is needed is a dual-port DDR4-DIMM that improves system reliability and availability and also provides DDR4 speed with low speed memory chips.

SUMMARY

Embodiments of the present invention relate to dual-port DDR4-DIMMs of SDRAM, MRAM, or RRAM for high-performance, high-density, high-reliability systems and multi-CPU servers. The dual-port design enables the use of existing SDRAM, MRAM and RRAM chips at low speed rates. The dual-port DDR4 DIMM comprises 1-to-2 data buffer splitters and a DDR3 or DDR2 to DDR4 adaptation circuit to increase (e.g., double or quadruple) the chip speed of SDRAM, MRAM, and RRAM chips. Furthermore, according to some embodiments, dual-port or quad-port DDR4 DIMMs can be used to form clusters of low-cost CPUs.

According to one embodiment, a memory system is disclosed. The memory system includes a first FPGA controller coupled to a first DDR4-SSD cluster, a first DDR4 DIMM and a second DDR4 DIMM. The memory system further includes a second FPGA controller coupled to a second DDR4-SSD cluster, the first DDR4 DIMM and the second DDR4 DIMM. The first and second FPGAs can share the access to the first and second DDR4 DIMMs and provide connectivity to a pool of network storage resources.

According to another embodiment, a DDR4 dual-port DIMM is disclosed. The DIMM includes an on-DIMM controller operable to receive commands from a first and second FPGA controller, a first network device coupled to the first FPGA controller and a second network device coupled to the second FPGA controller. A plurality of memory chips are disposed on the dual-port DIMM, and pairs of the plurality of memory chips are connected to 1-to-2 data buffer splitters, even bytes of the DIMM are routed to the first FPGA, and odd bytes of the DIMM are routed to the second FPGA.

According to another embodiment, a DDR4 dual-port DIMM is described including a controller operable to receive commands from a first and second FPGA controller. A plurality of first memory chips are disposed on a front side of the dual-port DIMM, where pairs of the plurality of first memory chips are connected to 1-to-2 data buffer splitters. A plurality of second memory chips disposed on a back side of the dual-port DIMM, where groups of four of the plurality of second memory chips are connected to pairs of the 1-to-2 data buffer splitters.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
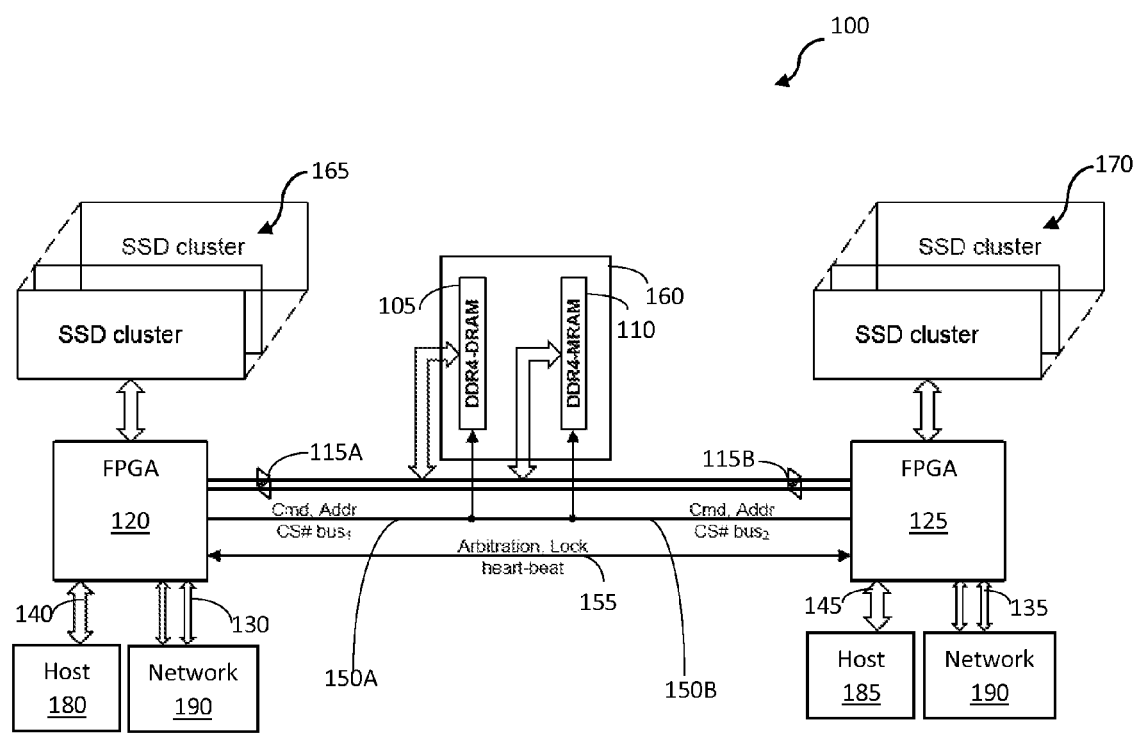
FIG. 1 is a block diagram of an exemplary dual-port DDR4 control circuits on a motherboard for DIMMs of SDRAM, MRAM, or RRAM according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Embodiments are well suited to performing various other steps or variations of the steps recited in the flowchart of the figures herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computing device. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of an electronic computing device that manipulates and transforms data represented as physical (electronic) quantities within the system's registers and memories into other data similarly represented as physical quantities within the system memories or registers or other such information storage, transmission or display devices.

Dual-Port DDR4-DIMMs of SDRAM and NVRAM for SSD-Blades and Multi-CPU Servers

Embodiments of the present invention relate to dual-port DDR4-DIMMs of SDRAM, MRAM, or RRAM for high-performance, high-density, high-reliability systems and multi-CPU servers. Furthermore, according to some embodiments, dual-port or quad-port DDR4 DIMMs are used to form clusters of low-cost CPUs.

Recently, it has become important to provide dual-port connectivity for solid state drive (SSD) and NVM primary modules. To this end, dual-port SSD/NVM devices may be clustered using ARM-core FPGA controllers, and DDR4-MRAM and DDR4-DRAMs modules may comprise dual-port memory devices. This approach eliminates the risk of a single point of failure along a data path. The dual-port design enables the use of existing SDRAM, MRAM and RRAM chips at low speed rates. The dual-port DDR4 DIMM comprises 1-to-2 data buffer splitters and a DDR3 or DDR2 to DDR4 adaptation circuit to increase (e.g., double or quadruple) the chip speed of SDRAM, MRAM, and RRAM chips.

Embodiments of the invention will now be described, although it will be understood that they are not intended to limit the claimed subject matter to these embodiments.

The dual-port DDR4 DIMM architecture described herein is used to interconnect multiple FPGAs, ARM-core CPUs, or x86 CPUs for low-cost, high-performance and high-reliability systems. Furthermore, dual-port DDR4 DIMMs implemented as storage blades with dual-port DDR4-SSDs provide dual-server active-active controls and redundant data path (avoiding the risk of a single point of failure), as well as a DDR4-MRAM module for writing data and auto-power-down protection to eliminate the need for a complex Non-Volatile Dual In-line Memory Module (NVDIMM) powered by a battery or super capacitor. The dual-port high-speed DDR4 DIMM is operable to cluster ARM CPUs or x86 CPUs as a low-cost alternative to the Intel QPI or AMD Hyperlink SerDes interconnections.

Dual-Port DDR4-DIMMs with 2-to-1 Data Buffers to Multiplex Data-Paths into Shared Memory Media With regard to FIG. 1, exemplary dual-port DDR4 control circuits 100 disposed on a motherboard (e.g., a PCB) for accessing DIMMs of SDRAM, MRAM, or RRAM are depicted according to embodiments of the present invention. Dual-port DDR4-DIMM 160 comprises DDR4-DRAM module 105 and DDR4-MRAM module 110 and is coupled to two sets of data buffers 115A and 115B on the motherboard. FPGAs 120 and 125 are connected to the two sets of data buffers 115A and 115B by interleaved accesses to the DRAM and MRAM of DDR4-DIMM 160. FPGAs 120 and 125 also control the attached DDR4-SSD DIMM clusters 165 and 170, respectively. According to some embodiments, FPGAs 120 and 125 comprise ARM64 processors. FPGAs 120 and 125 are also connected to host data paths 140 and 145, respectfully. Host data paths 140 and 145 are configured for low-latency active-active gateway controls and provide access by attached host 180 and host 185.

FPGAs 120 and 125 are also connected to a fabric network using dual-port network connections 130 and 135, respectively. The dual port connections 130 and 135 connect the FPGAs to four channels of remote direct memory access (RDMA) switched fabric that provides connectivity to a network 190 comprising a pool of networked resources. The pool of resources may comprise virtual memory, CPU resources, and non-volatile memory pools (e.g., flash memory chips). FPGAs 120 and 125 may be quarantined as failures or rebooted or recovered using data buffers 115 and command buses 150A and 150B. A heart beat signal is shared between FPGAs 120 and 125 over data bus 155.

The DIMMs of exemplary circuit 100 comprises a PCIE DMA master interface and virtualized slave memory. Peripheral Component Interconnect Express (PCIe) input-output (I/O) devices may access the SDRAM and MRAM using DMA-p2p (peer-to-peer) zero-copy data transfers, thereby bypassing the host memories. An rDMA-device controller may be programmed by an attached host using host data path 140 or 145, or a CPU from the pool linked by the rDMA-fabric infrastructure using dual-port network connections 130 and 135, where the metadata is stored in slave-memory.

According to some embodiments, the dual-port DDR4-DIMM illustrated in FIG. 1 includes two sets of DDR4 data buffers used to multiplex (e.g., interleave) two data paths into shared memory comprising DRAM, MRAM, or Flash-NAND chips on a DIMM device. The two paths can use active-passive (standby) or active-active modes to increase the reliability and availability of the storage systems.

A TCP/IP offload engine (TOE) card may be used to directly write incoming packets to MRAM 110 slave-memory using DMA-p2p without hopping the host memory. An FPGA (e.g., FPGA 120 or 125) may be used to extract the header from the data and write the header to host memory using DMA. The CPU may also program FPGA 120 or 125 to distribute related data blocks to the assigned flash pages in DDR4-SSD cluster 165 or 170.

Figure 2:
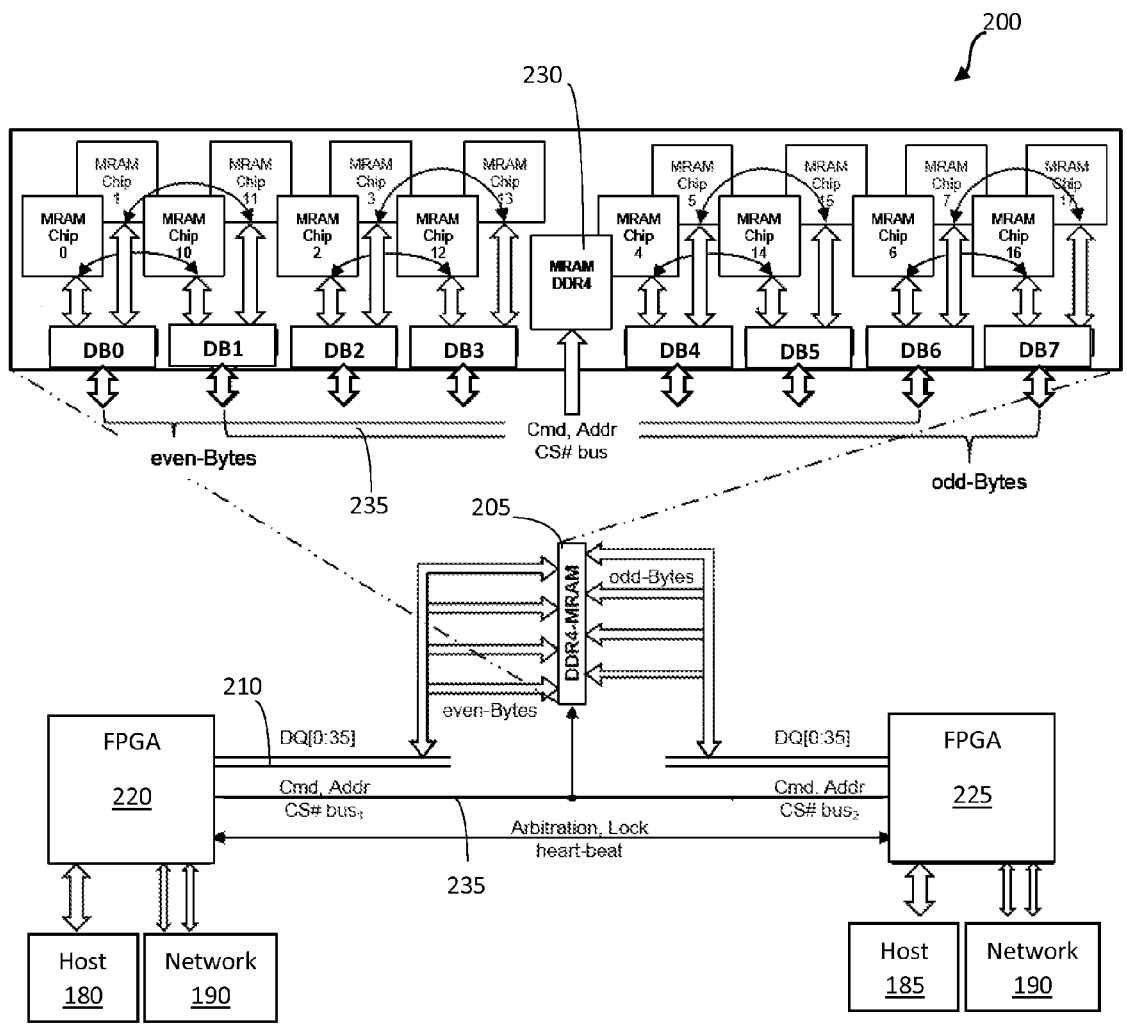
FIG. 2 is a block diagram of an exemplary dual-port DDR4-DIMM architecture with dual-port control circuits on the DIMM according to embodiments of the present invention.

With regard to FIG. 2, an exemplary DDR4-MRAM dual-port DIMM architecture 200 disposed on a DIMM board is depicted according to some embodiments of the present invention. DDR4-MRAM DIMM 205 comprises MRAM Chips 0-17 and on-DIMM dual-port 1-to-2 Data buffers DB0-DB7. The data buffers DB0-DB7 are reversed to act as 1-to-2 splitters and double the speed of relatively slow memory chips for DD4 applications. On-DIMM controller 230 receives signals from FPGAs 220 and 225 over command bus 235.

Even-bytes of DDR4-MRAM DIMM 205 connect to FPGA 220, and odd-bytes connect to FPGA 225, thereby doubling the speed of MRAM chips. The 1-to-2 data buffer splitters divide the host data bus bytes DQ[0:7] into two channels, MDQ[0:7] and MDQ[8:15]. Four even bytes are split by the 1-to-2 data buffers and distributed to MRAM Chips 0-7, and four odd bytes are split by the 1-to-2 data buffers and distributed to MRAM Chips 10-17 to double the chip speed of DDR4-MRAM DIMM 205. Hosts 1 and 2 are connected to DQ[0:31] of the DDR4 bus 210 using PCIe. MRAM Chip 8 and 9 are packaged into DQ[32:35] as error correction code (ECC) bytes.

Figure 3:
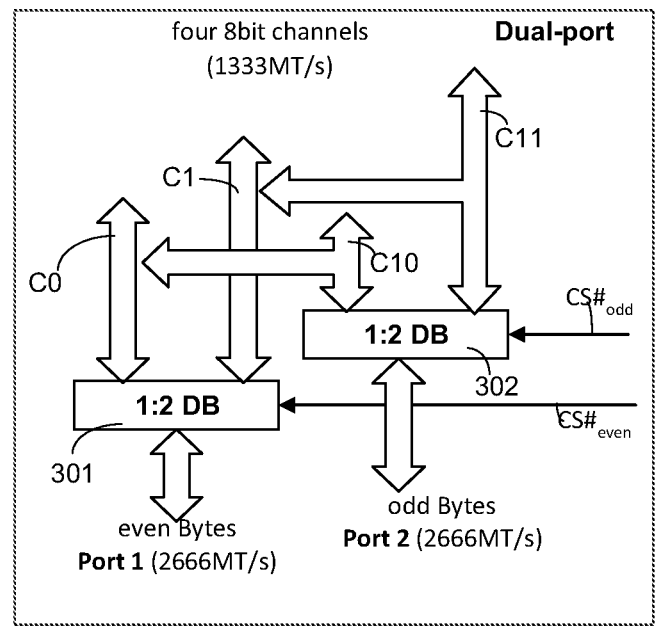
FIG. 3 is a block diagram of exemplary interconnected on-DIMM 1-to-2 data buffer splitters for dual-port operations according to embodiments of the present invention.

With regard to FIG. 3, exemplary 1-to-2 on-DIMM data buffer splitters 301 and 302 are depicted according to embodiments of the present disclosure. Splitters 301 and 302 are connected by interleaving $CS\#_{even}$ and $CS\#_{odd}$ signals. Splitter 301 receives even bytes over a first port at 2666 MT/s and splitter 302 receives odd bytes over a second port at 2666 MT/s. As described above, even bytes of the DIMM connect to one FPGA and odd bytes connect to another FPGA. By interleaving the connection in this way, two hosts can share the 18 MRAM chips as depicted in FIG. 2. Arranging the data buffer splitters in this way produces four 8-bit channels (e.g., C0, C1, C10, and C11). According to some embodiments, the 1-to-2 data buffer splitters comprise a modern 8 bit-to-16 bit splitter chip with ½ rate DQS chip clocks.

Figure 4:
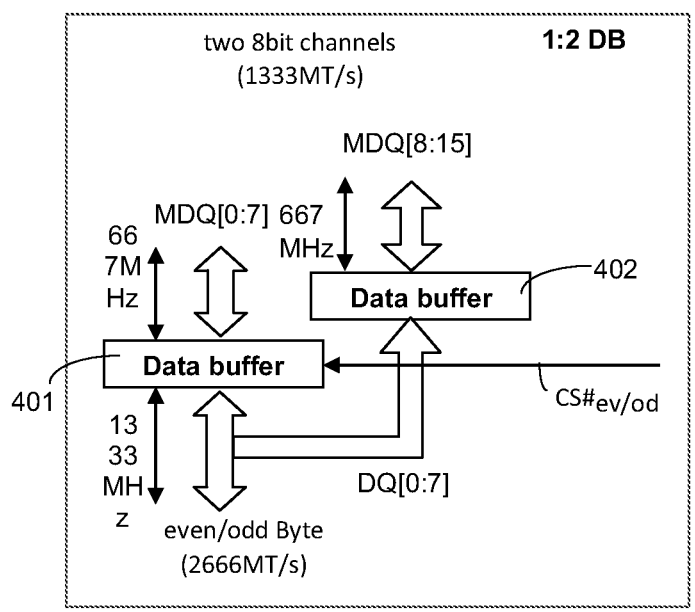
FIG. 4 is a block diagram of an exemplary pair of interconnected on-DIMM data buffers for doubling speed according to embodiments of the present invention.

With regard to FIG. 4, an exemplary 1-to-2 on-DIMM data buffer splitter comprising two exemplary data buffers 401 and 402 for outputting two 8-bit channels is depicted according to embodiments of the present disclosure. All bytes (even and odd) of DQ[0:7] are received by data buffers 401 and 402 at 1333 MHz. Data buffer 401 outputs 8 bits (e.g., MDQ[0:7]) at 667 MHz and data buffers 402 outputs 8 bits (e.g., MDQ[8:15]) at 667 MHz.

Figure 5:
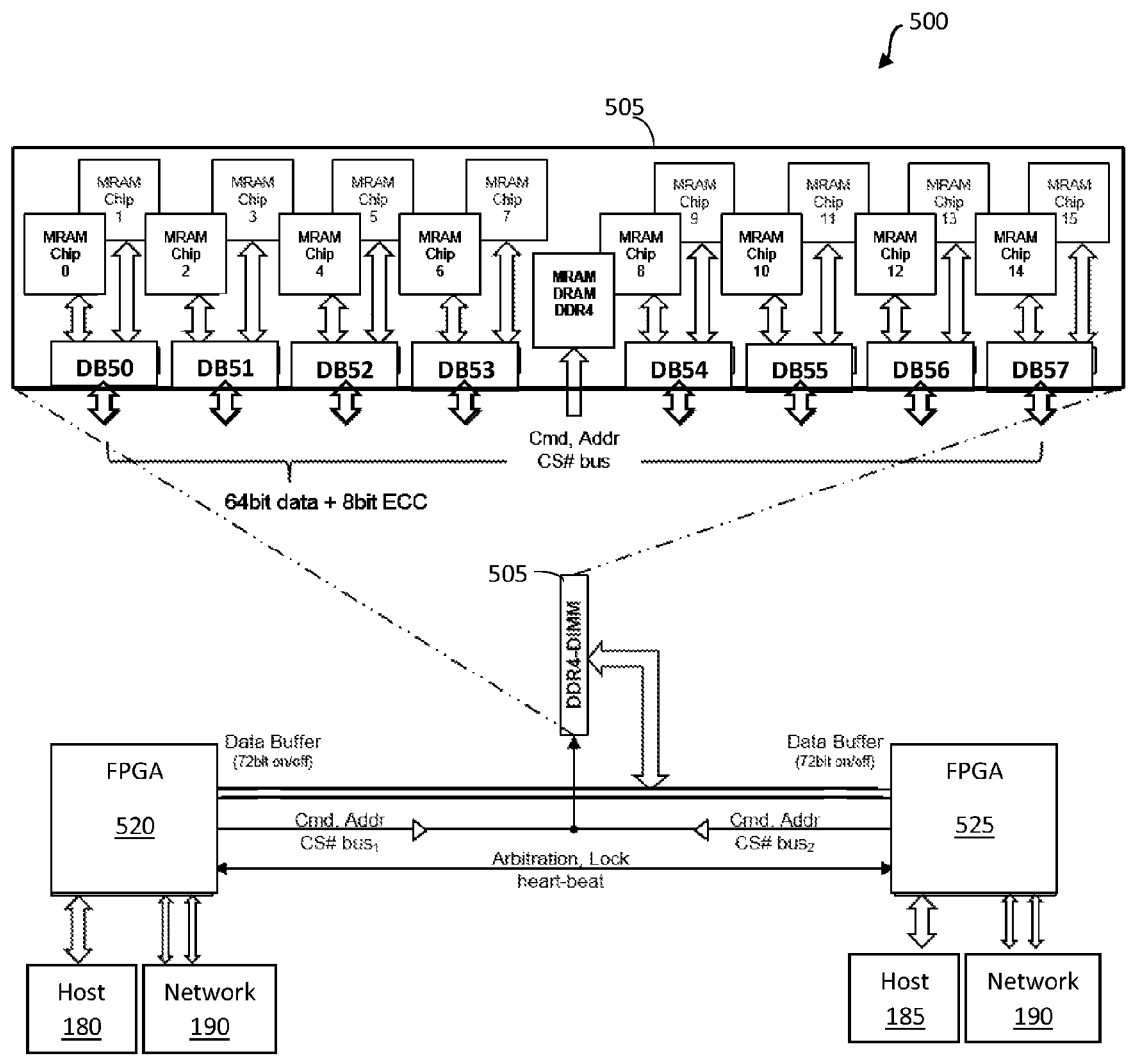
FIG. 5 is a block diagram of an exemplary high-speed DDR4-DIMM architecture for doubling the chip speed of attached DDR3-SDRAM chips and quadrupling the chip speed of attached LPDDR2-MRAM chips according to embodiments of the present invention.

DDR4-DIMM Architecture with 1-to-2 Data Buffer Splitter to Increase SDRAM and NVM Chip Speed With regard to FIG. 5, an exemplary DDR4-DIMM architecture 500 is depicted according to embodiments of the present invention. DDR4-DIMM architecture 500 is operable to double the chip speed of attached SDRAM chips and quadruples the chip speed of attached MRAM chips. MRAM chips 0-15 are disposed on a front side of DIMM 505, and 16 SDRAM chips are disposed on a back side of DIMM 505 in a similar manner. On the front side of DIMM 505, 1-to-2 data buffer splitters DB50-DB57 are coupled to pairs of SDRAM chips to double the SDRAM chip speed. On the back side of DIMM 505, pairs of 1-to-2 data buffer splitters are connected to groups of four MRAM chips to quadruple the MRAM chip speed. The data buffer splitters may be modified with ½ and ¼ clock-dividers for low speed chips.

Figure 6:
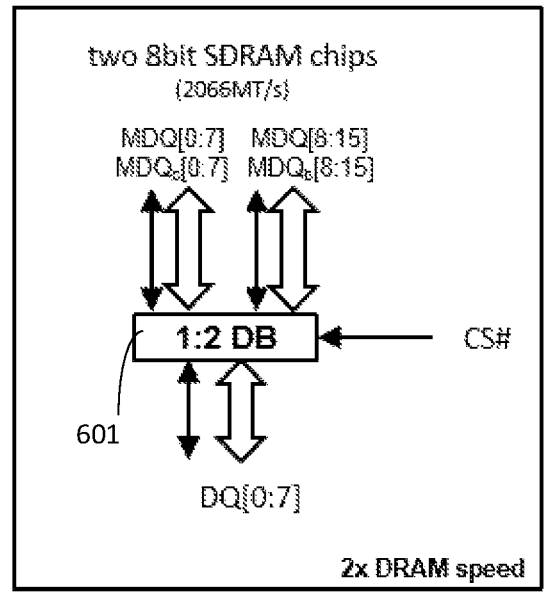
FIG. 6 is a block diagram of an exemplary 1-to-2 on-DIMM data buffer for doubling speed according to embodiments of the present invention.

With regard to FIG. 6, an exemplary 1-to-2 on-DIMM Data buffer splitter 601 is depicted according to embodiments of the present disclosure. 1-to-2 Data buffer splitter 601 doubles the SDRAM chip speed by splitting MDQ[0:7] into two bytes DQ[0:7] and DQ[8:15] on the front side of DIMM 505 and two bytes DQb[0:7] and DQb[8:15] on the back side of DIMM 505 with a ½ DQS clock rate (e.g., 2066 MHz master clock reduced to 1033 MHz chip clock).

Figure 7:
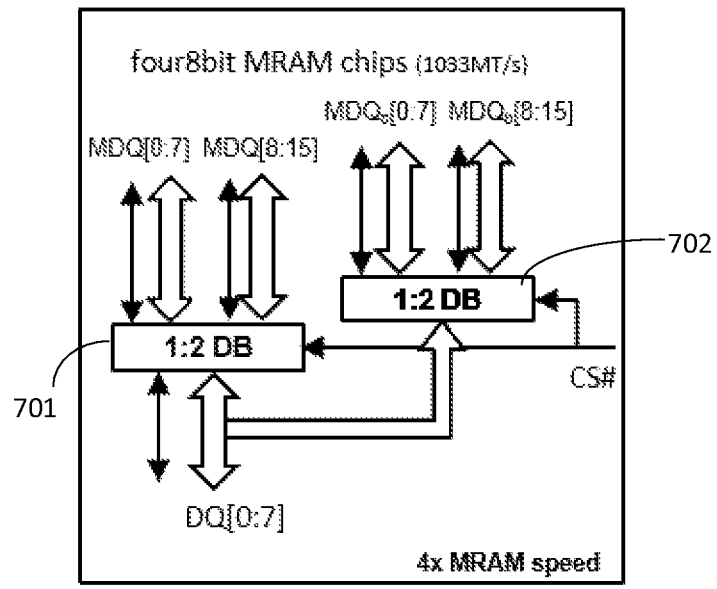
FIG. 7 is a block diagram of an exemplary interconnected 1-to-2 on-DIMM data buffer for quadrupling speed according to embodiments of the present invention.

With regard to FIG. 7, two exemplary 1-to-2 on-DIMM data buffer splitters 701 and 702 are depicted according to embodiments of the present disclosure. Splitters 701 and 702 are interconnected to form a 1-to-4 splitter. Splitters 701 and 702 split MDQ[0:7] into 4 bytes, DQ[0:7], DQ[8:15], DQb[0:7], and DQb[8:15] with ¼ speed DQS clock for slow 1033 MTs MRAM chips. This configuration is operable to quadruple the speed of attached MRAM chips. Additionally, DDR4-to-DDR3 or DDR4-to-LPDDR2 bus adaptations with proper signal levels and bus terminations/relays are performed by the data buffer splitters.

CPU Ganging Using Dual-Port SDRAM or NVRAM

Figure 8:
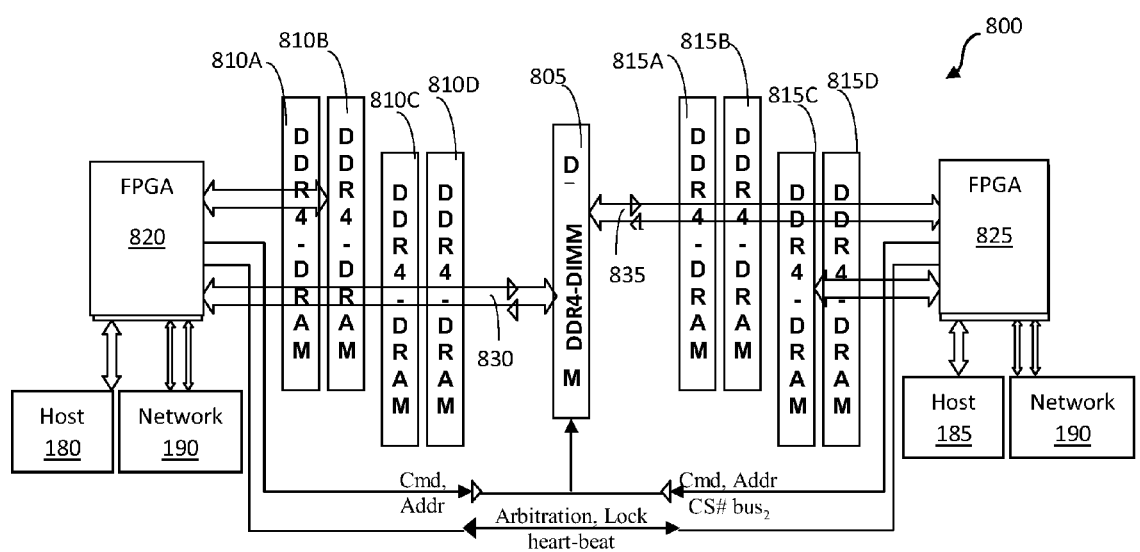
FIG. 8 is a block diagram of two exemplary CPUs ganged together using an exemplary DDR4 memory module according to embodiments of the present invention.

With regard to FIG. 8, an exemplary control circuit 800 for ganging (e.g., grouping or clustering) two exemplary FPGAs 820 and 825 using an exemplary dual-port DDR4-DIMM 805 is depicted according to embodiments of the present invention. The FPGAs may comprise ARM64 processors or x86 processors, for example. FPGA 820 communicates with shared DDR4-DIMM 805 over 72-bit data buffer 830, and FPGA 825 communicates with shared DDR4-DIMM 805 over 72-bit data buffer 835. DDR4-DIMM 805 comprises SDRAM or NVRAM chips. DDR4-DIMMs 810A-810D are connected to FPGA 820 and are not shared with FPGA 825. DDR4-DIMMs 815A-815D are connected to FPGA 825 and are not shared with FPGA 820.

Figure 9:
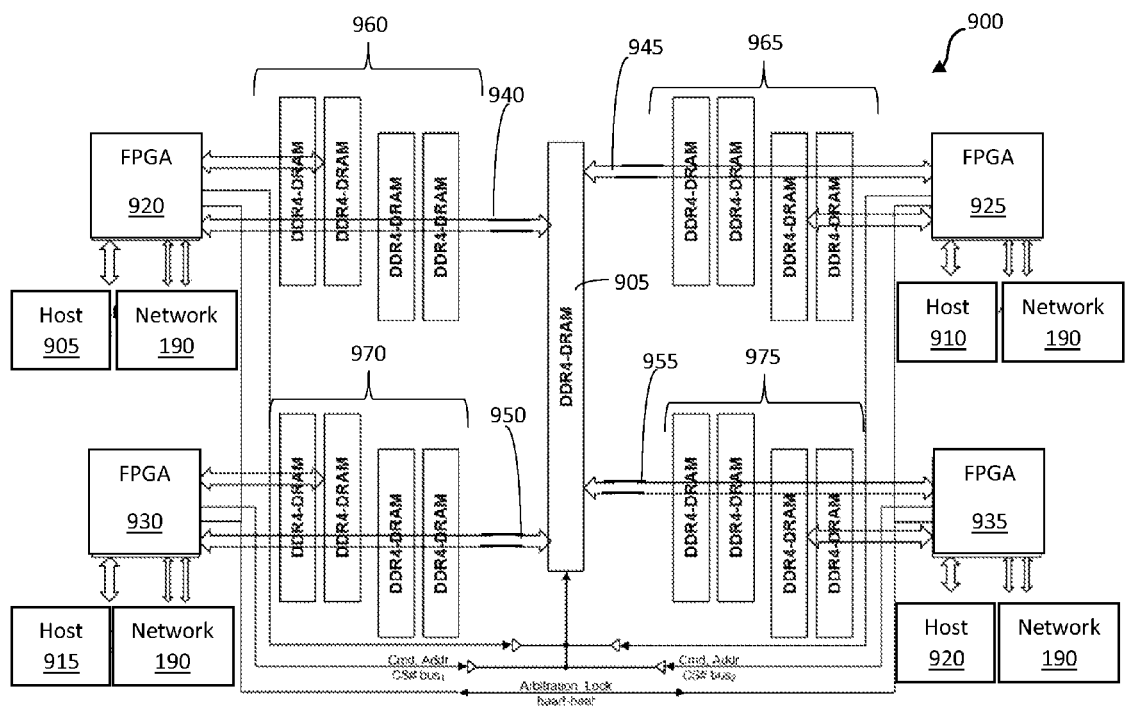
FIG. 9 is a block diagram of four exemplary CPUs ganged together using an exemplary DDR4 memory module according to embodiments of the present invention.

With regard to FIG. 9, an exemplary control circuit 900 for ganging four FPGAs or low cost CPUs 920-935 using shared DDR4-DIMM 905 is depicted according to embodiments of the present invention. Each FPGA communicates with DDR4-DIMM 905 over a separate data buffer (e.g., data buffers 940-955). Each FPGA is also connected to one of memory clusters 960-975 that is not shared with the other FPGAs.

Figure 10:
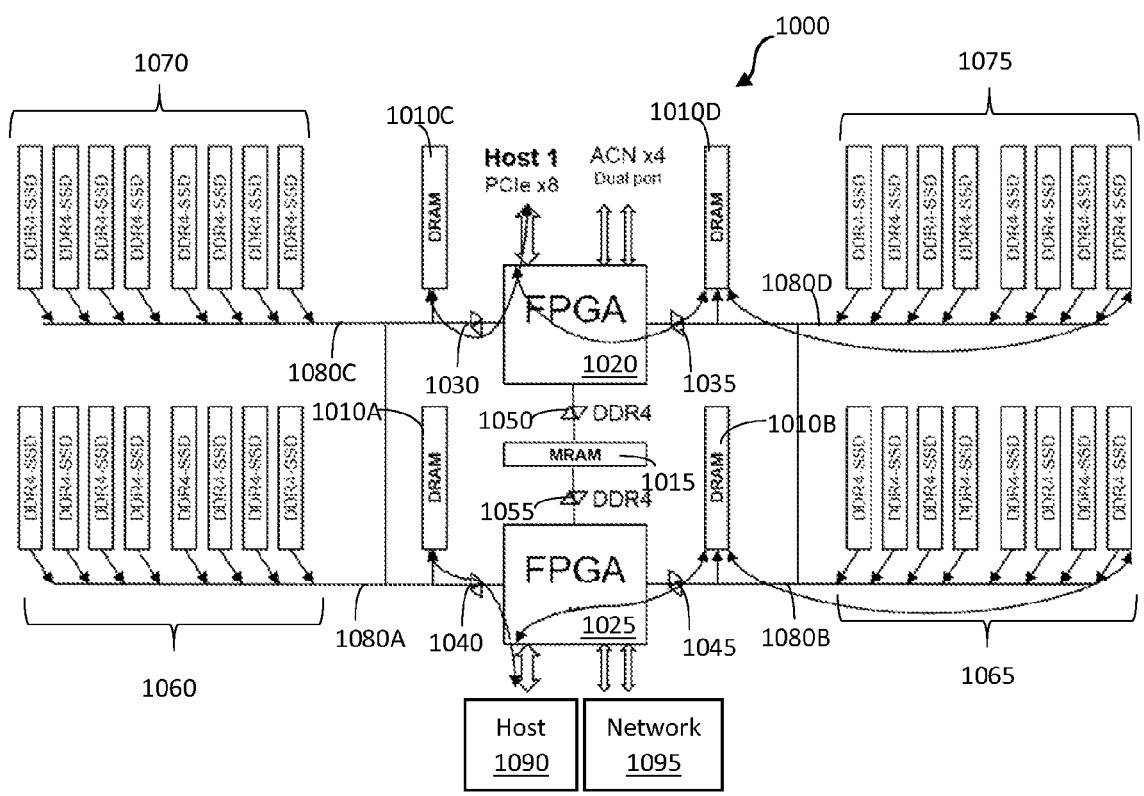
FIG. 10 is a block diagram of exemplary DDR4-SSD clusters with dual-port DIMMs and low-latency MRAM and DRAM clusters for virtualized shared primary storage according to embodiments of the present invention.

With regard now to FIG. 10, an exemplary architecture 1000 for providing CPU-to-FPGA low latency DDR4 access to shared MRAM module 1015, DRAM modules 1010A-1010D, and SSD clusters 1060-1075 for virtualized and shared primary storage is disclosed according to embodiments of the present disclosure. DDR4 buses 1080A-1080D provide a single channel, peer-to-peer 8-bit link for the 8 dual-port DDR4-SSD DIMMs of SSD clusters 1060-1075 using an on-DIMM load-reducing data buffer to increase maximum bus speed. The dual-port DDR4-SSD DIMMs provide active-active data access for two hosts using FPGAs 1020 and 1025. The FPGAs 1020 and 1025 are configured to split headers from data blocks and allow host DRAM to be bypassed. DDR4 data-buffers 1030-1055 are used to support multiple DIMMs, for example, when the bus traces used are of insufficient length. Certain printed circuit boards include a bus trace that terminates before reaching every DIMM socket, and the data-buffers may be used to receive (and terminate) the signal from the memory controllers, and re-propagate the signal to the DIMMs that the bus trace does not reach. According to some embodiments, the DDR4-SSD devices comprise 10.75 TB of storage per DIMM, and the DDR4-DRAM modules comprise 16 GB of storage per DIMM. FPGA 1025 is connected to attached network host 1090 using PCIe and network fabric 1095 using a dual-channel rDAM connection.

Figure 11:
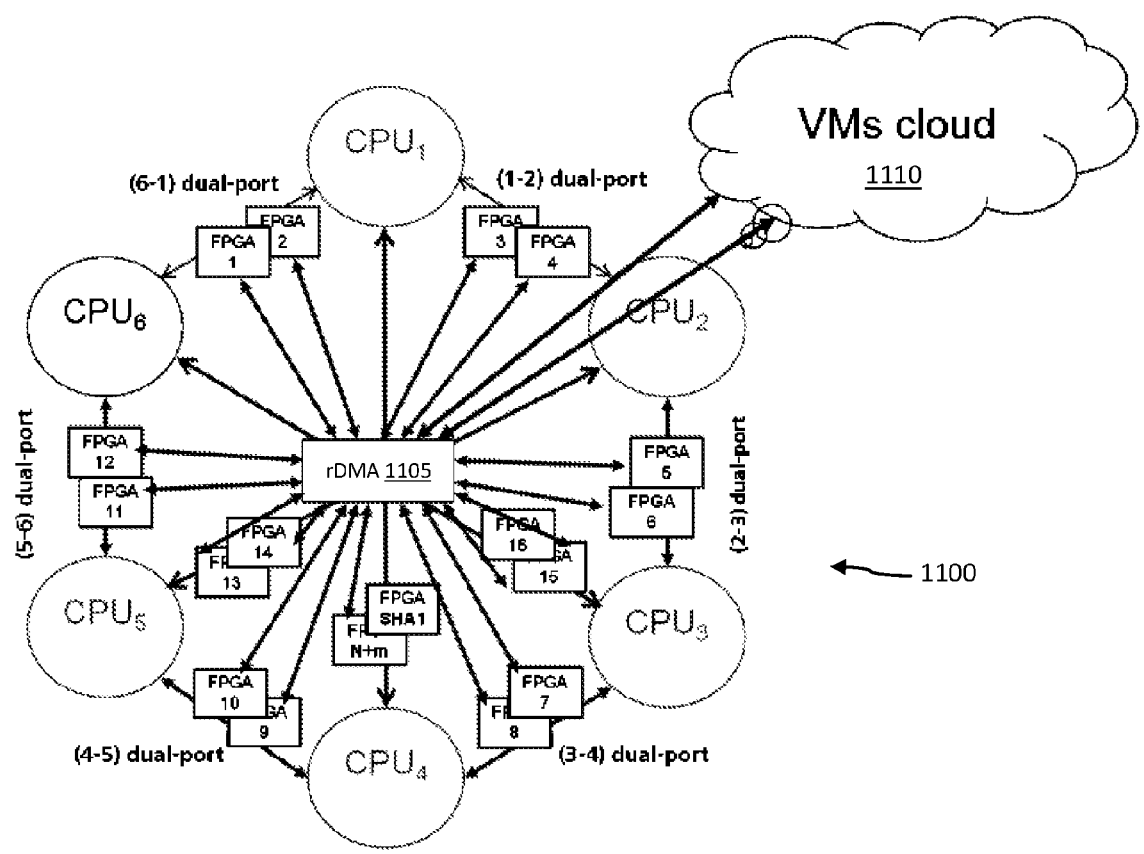
FIG. 11 is a block diagram of an exemplary 6-CPU cluster interconnected using an exemplary rDAM fabric chipset 1105 with adjacent and cross-over interconnections according to embodiments of the present disclosure.

With regard to FIG. 11, an exemplary 6-CPU cluster 1100 is depicted according to embodiments of the present disclosure. The CPUs are interconnected using an exemplary rDAM fabric chipset 1105 with adjacent and cross-over interconnections. rDMA fabric chipset 1105 provides scalability and dynamic load-balancing for SSD storage virtualization over virtual memory (VM) cloud 1110. According to some embodiments, SSD storage virtualization is provided as a 6 node dual-port cluster. According to other embodiments, 5 dual-port nodes are clustered and a $6^{th}$ node provides redundant storage. Two adjacent CPUs and two CPUs positioned across from one another share access to dual-port DDR4-SSD, DDR4-MRAM, and DDR4-DRAM. In the exemplary embodiment of FIG. 11, CPU1 is linked to CPU2, CPU4, and CPU6. CPU2 is linked to CPU1, CPU3, and CPU5. CPU3 is linked to CPU2, CPU4, CPU6, and so on. According to some embodiments, the CPUs are connected using PCIe. FPGAs 1-16 are coupled to the CPUs and control the attached memory module.

Embodiments of the present invention are thus described. While the present invention has been described in particular embodiments, it should be appreciated that the present invention should not be construed as limited by such embodiments, but rather construed according to the following claims.

What is claimed is:

1. A memory system, comprising:
 a first FPGA controller coupled to a first SSD cluster, a first DDR4 DIMM and a second DDR4 DIMM;
 a second FPGA controller coupled to a second SSD cluster, the first DDR4 DIMM and the second DDR4 DIMM, wherein the first and second FPGAs are operable to share access to the first and second DDR4 DIMMs and provide connectivity to a plurality of network resources; and
 a first network host attached to the first FPGA controller and a second network host attached to the second FPGA controller, wherein the first and second FPGA controllers provide a DMA-master interface and virtualized slave memory for the attached network hosts.

2. The memory system of claim 1, wherein the first DIMM is comprised of DRAM.

3. The memory system of claim 1, wherein the second DIMM is comprised of at least one of MRAM, PCRAM, and RRAM chips.

4. The memory system of claim 1, wherein the first and second FPGA controllers comprise ARM64 processors.

5. The memory system of claim 1, wherein the first and second FPGA controllers comprise x86 processors.

6. The memory system of claim 1, wherein the first and second network hosts are operable to program an rDMA controller.

7. The memory system of claim 6, wherein the first and second network hosts are operable to access the first and second DDR4 DIMMs using a peer-to-peer zero-copy data transfer.

8. The memory system of claim 7, wherein the using a peer-to-peer zero-copy data transfer bypasses host memory.

9. A memory system, comprising:
 a first FPGA controller coupled to a first SSD cluster, a first DDR4 DIMM and a second DDR4 DIMM;
 a second FPGA controller coupled to a second SSD cluster, the first DDR4 DIMM and the second DDR4 DIMM, wherein the first and second FPGAs are operable to share access to the first and second DDR4 DIMMs and provide connectivity to a plurality of network resources; and
 a command bus coupled to the first and second FPGA controller, wherein the command bus is operable to quarantine and reboot the first and second FPGA during failure.

10. A DDR4 dual-port DIMM, comprising:
 a controller operable to receive commands from a first and second FPGA controller;
 a first network device coupled to the first FPGA controller and a second network device coupled to the second FPGA controller; and
 a plurality of memory chips disposed on the dual-port DIMM, wherein pairs of the plurality of memory chips are connected to 1-to-2 data buffer splitters, even bytes of the DIMM are routed to the first FPGA, and odd bytes of the DIMM are routed to the second FPGA.

11. The DDR4 dual-port DIMM of claim 10, further comprising a first command bus coupled to the DIMM and the first FPGA, and a second command bus coupled to the DIMM and the second FPGA, wherein the first and second command buses are interleaved so that exactly one 1-to-2 data buffer splitter is operable at a time.

12. The DDR4 dual-port DIMM of claim 10, wherein the network devices are coupled to the FPGA controllers using PCIe.

13. The DDR4 dual-port DIMM of claim 10, wherein the data buffer splitters comprise 8-bit chips.

14. The DDR4 dual-port DIMM of claim 13, wherein the 8-bit chips are modified with ½ speed clocks.

15. The DDR4 dual-port DIMM of claim 10, wherein the memory chips comprise MRAM.

16. The DDR4 dual-port DIMM of claim 15, wherein the effective speed of the MRAM is doubled.

17. A DDR4 dual-port DIMM, comprising:
- a controller operable to receive commands from a first and second FPGA controller;
- a plurality of first memory chips disposed on a front side of the dual-port DIMM, wherein pairs of the plurality of first memory chips are connected to 1-to-2 data buffer splitters and controlled by the controller; and
- a plurality of second memory chips disposed on a back side of the dual-port DIMM, wherein groups of four of the plurality of second memory chips are connected to pairs of the 1-to-2 data buffer splitters and controlled by the controller, the effective speed of the first memory chips is doubled, and the effective speed of the second memory chips is quadrupled.

18. The DDR4 dual-port DIMM of claim 17, wherein the first memory chips comprise SDRAM and the second memory chips comprise MRAM.

19. The DDR4 dual-port DIMM of claim 17, wherein the DDR4 dual-port DIMM is operable to cluster 2 or more attached CPUs using shared memory.

* * * * *